(12) United States Patent
Ahn et al.

(10) Patent No.: US 12,717,226 B2
(45) Date of Patent: Aug. 25, 2026

(54) PELLICLE HOLDING MODULE, PELLICLE THERMAL DURABILITY EVALUATION DEVICE COMPRISING SAME, AND PELLICLE THERMAL DURABILITY EVALUATION METHOD

(71) Applicant: IUCF-HYU (INDUSTRY-UNIVERSITY COOPERATION FOUNDATION HANYANG UNIVERSITY), Seoul (KR)

(72) Inventors: Jin Ho Ahn, Seoul (KR); Seong Ju Wi, Seoul (KR); Yong Ju Jang, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 682 days.

(21) Appl. No.: 18/179,875

(22) Filed: Mar. 7, 2023

(65) Prior Publication Data

US 2023/0251568 A1 Aug. 10, 2023

Related U.S. Application Data

(63) Continuation of application No. PCT/KR2021/010473, filed on Aug. 9, 2021.

(30) Foreign Application Priority Data

Sep. 17, 2020 (KR) ........................ 10-2020-0120062

(51) Int. Cl.
*G03F 1/84* (2012.01)
*G03F 1/62* (2012.01)
(Continued)

(52) U.S. Cl.
CPC .................. *G03F 1/84* (2013.01); *G03F 1/62* (2013.01); *G03F 7/70983* (2013.01); *G03F 1/66* (2013.01)

(58) Field of Classification Search
CPC ..... G03F 1/62; G03F 1/83; G03F 1/84; G03F 7/70983; G01J 2005/0074; G01J 5/802; G01K 17/003; G01N 25/005
See application file for complete search history.

(56) References Cited

U.S. PATENT DOCUMENTS 5,436,464 A * 7/1995 Hayano .................. G01N 21/94 250/225
5,929,977 A * 7/1999 Ozawa ................ G03F 7/70558 355/71
(Continued)

FOREIGN PATENT DOCUMENTS

CN 107941850 A * 4/2018 ............ G01N 25/20
JP 10-176918 A 6/1998
(Continued)

OTHER PUBLICATIONS

Machine translation of CN-107941850-A (Year: 2018).*
(Continued)

*Primary Examiner* — Steven H Whitesell
(74) *Attorney, Agent, or Firm* — Sughrue Mion, PLLC

(57) ABSTRACT

Provided is a pellicle thermal durability evaluation device. The pellicle thermal durability evaluation device may comprise: a chamber; a pellicle holder which is disposed in the chamber and on which a pellicle is seated; a durability measurement unit including a temperature measurement module for measuring the temperature of the pellicle seated on the pellicle holder; and a light source unit which irradiates the pellicle by controlling the intensity of light according to the type of the pellicle seated on the pellicle holder.

9 Claims, 17 Drawing Sheets

(51) Int. Cl.
*G03F 1/66* (2012.01)
*G03F 7/00* (2006.01)

(56) References Cited

U.S. PATENT DOCUMENTS

2008/0106721 A1* 5/2008 Hirano ................ G03F 7/70558
355/68
2018/0314150 A1* 11/2018 Brouns ..................... G03F 1/66
2020/0341366 A1* 10/2020 Brouns ............... G03F 7/70891

FOREIGN PATENT DOCUMENTS

| | | | |
|---|---|---|---|
| JP | 2014-215588 | A | 11/2014 |
| JP | 2019-174628 | A | 10/2019 |
| KR | 10-2013-0060351 | A | 6/2013 |
| KR | 10-2020-0066540 | A | 6/2020 |
| KR | 10-2020-0088529 | A | 7/2020 |

OTHER PUBLICATIONS

Luigi Scaccabarozzi, et al., “Investigation of EUV pellicle feasibility”, Proc. of SPIE, pp. 867904-1-867904-12, vol. 8679.
Carmen Zoldesi, et al., “Progress on EUV Pellicle development”, Proc. of SPIE, pp. 90481N-1-90481N-10, vol. 9048.
Dario L. Goldfarb, et al., “Thermo-mechanical behavior of EUV pellicle under dynamic exposure conditions”, Proc of SPIE, pp. 977621-1-977621-11, vol. 9776.
International Search Report for PCT/KR2021/010473 dated Dec. 28, 2021 [PCT/ISA/210].

* cited by examiner

[Fig. 2]
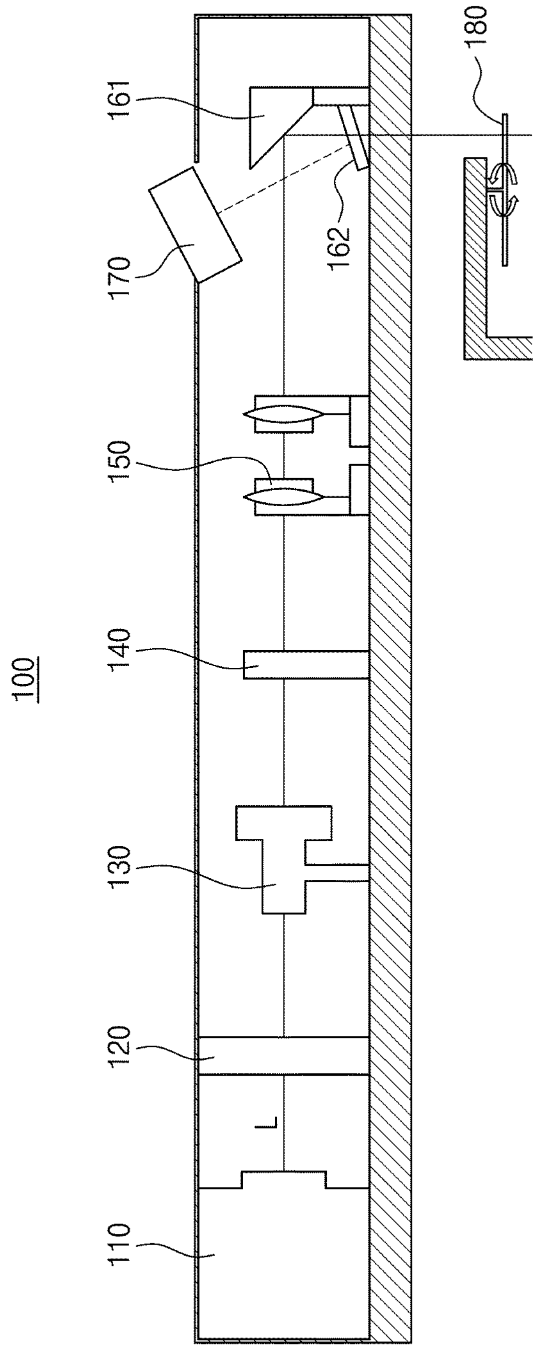

【Fig. 3】
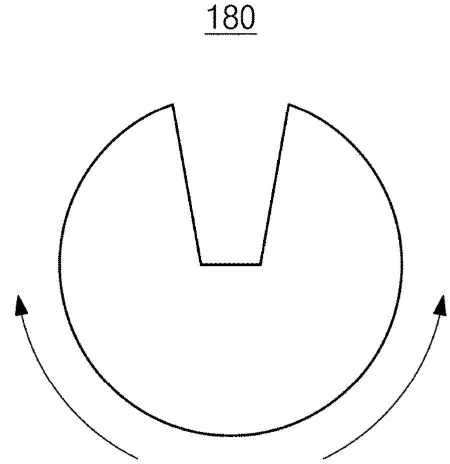

【Fig. 4】
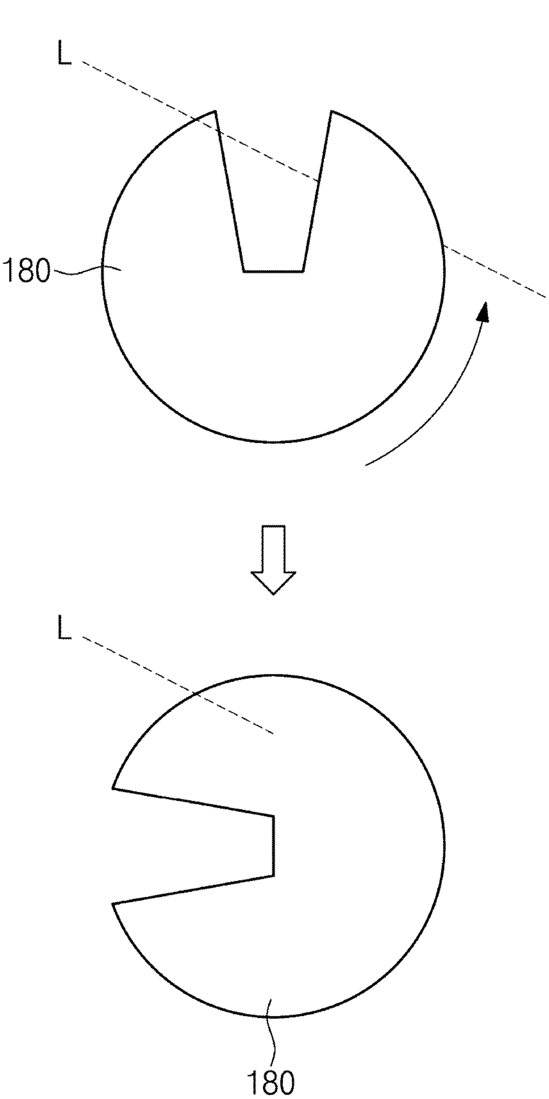

【Fig. 5】
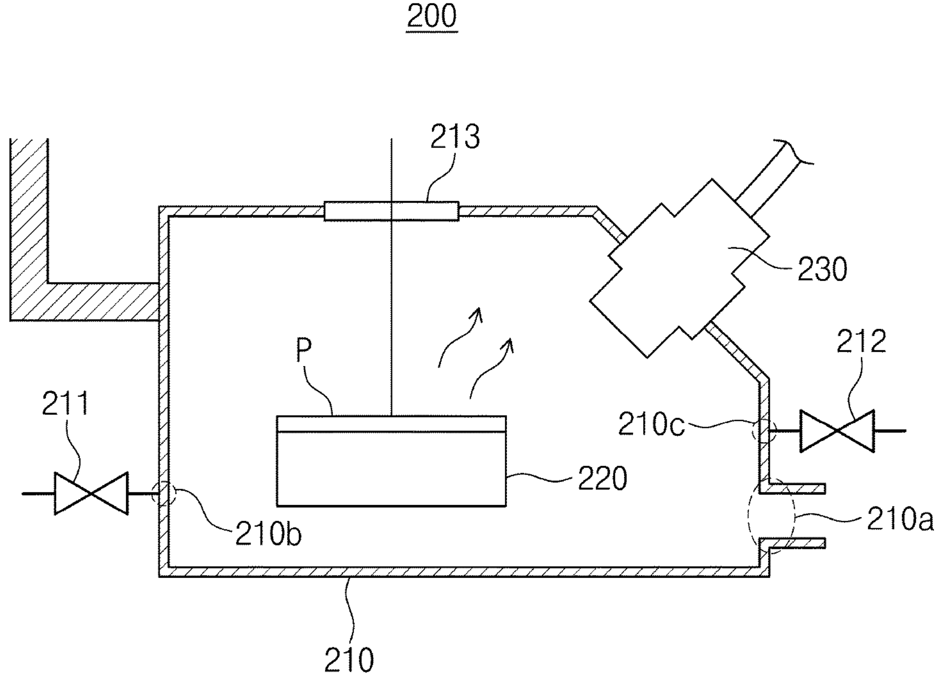

【Fig. 6】
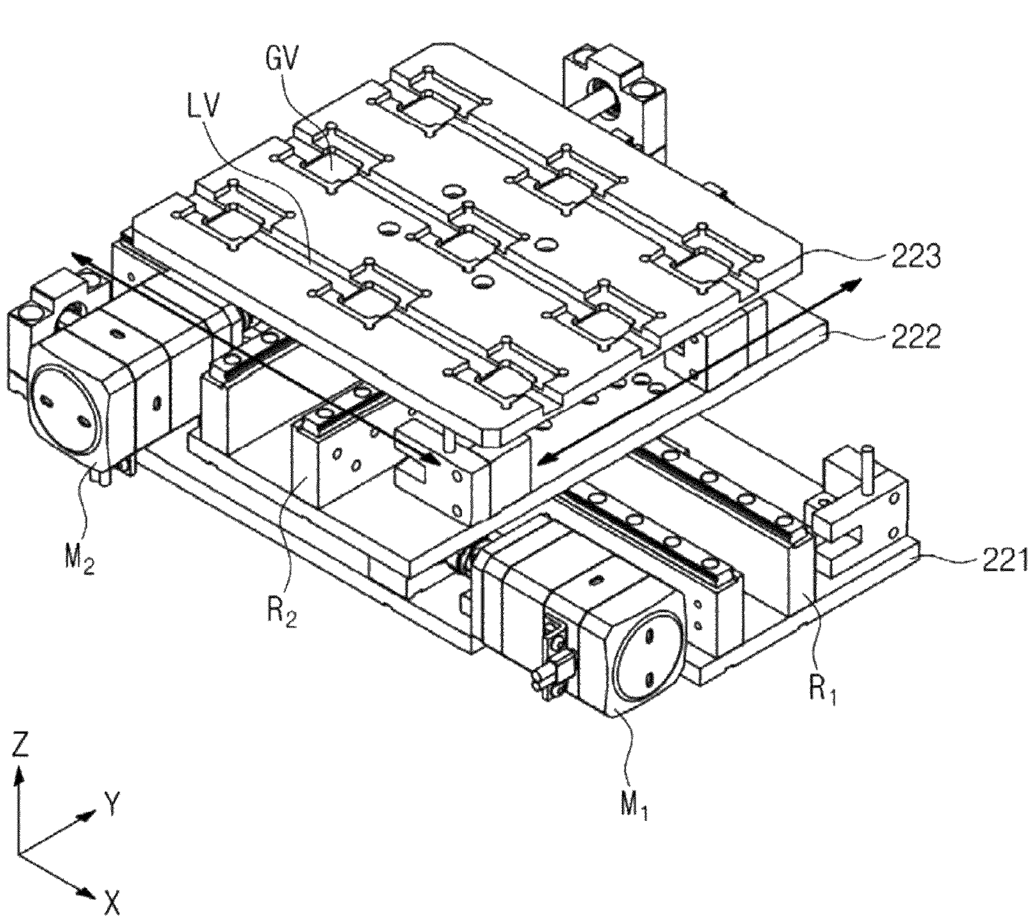

【Fig. 7】
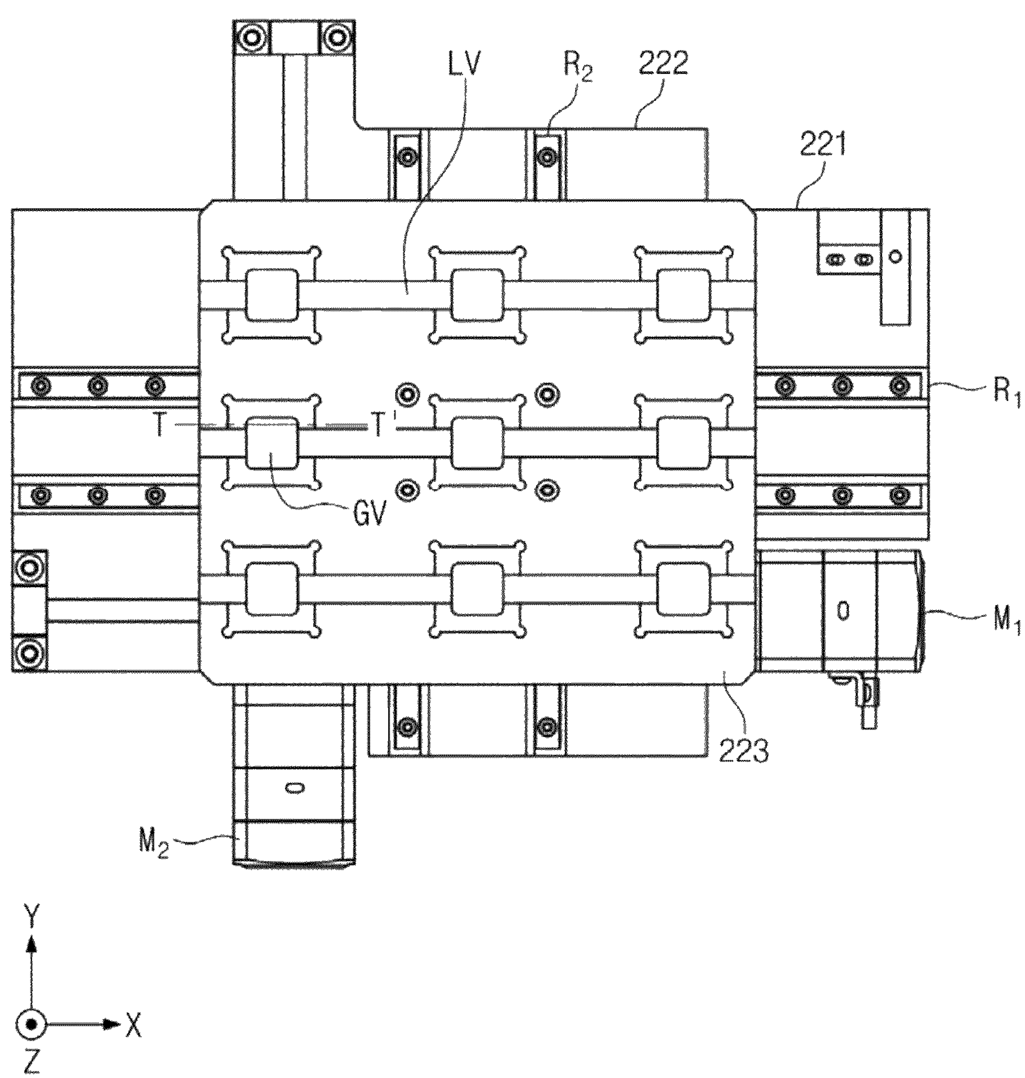

【Fig. 8】
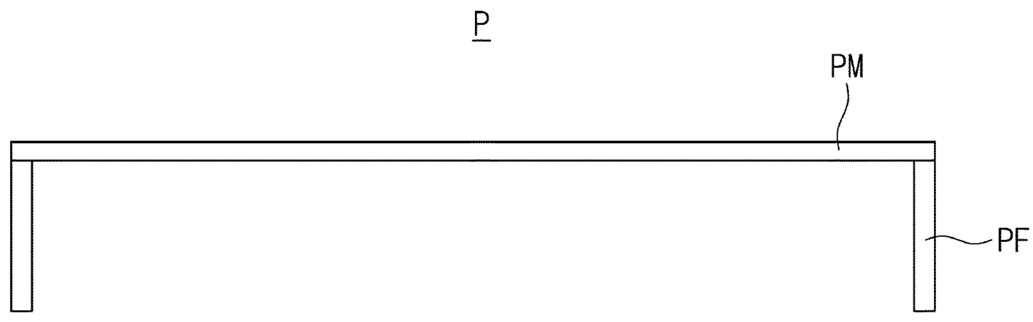
【Fig. 9】
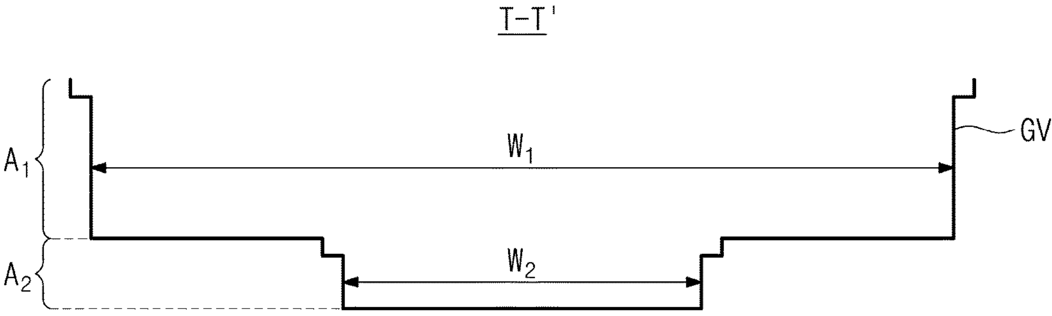

【Fig. 10】
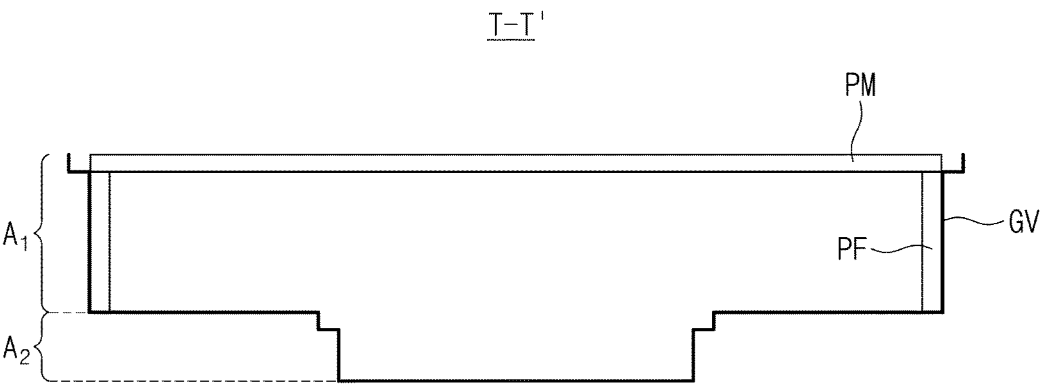

【Fig. 11】
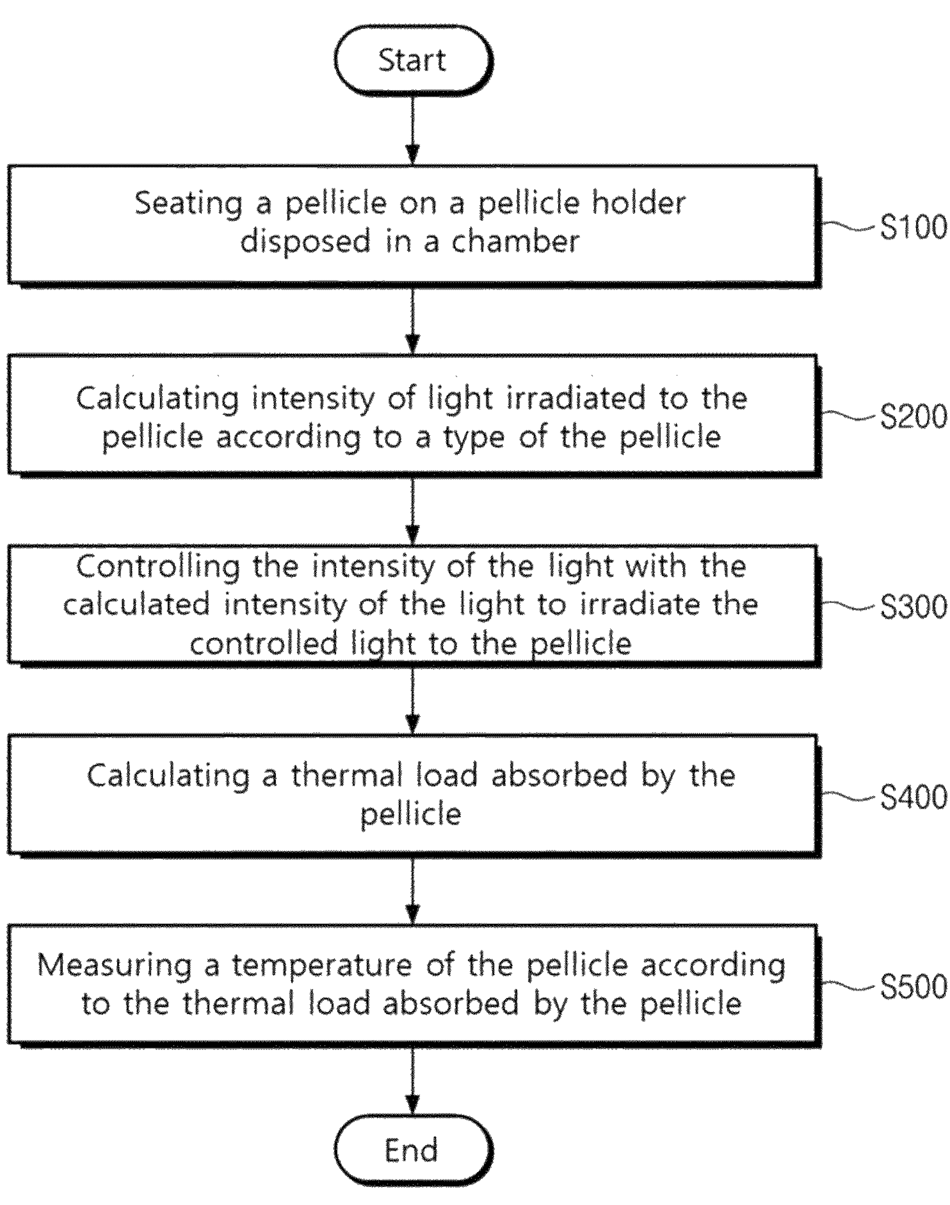

【Fig. 12】
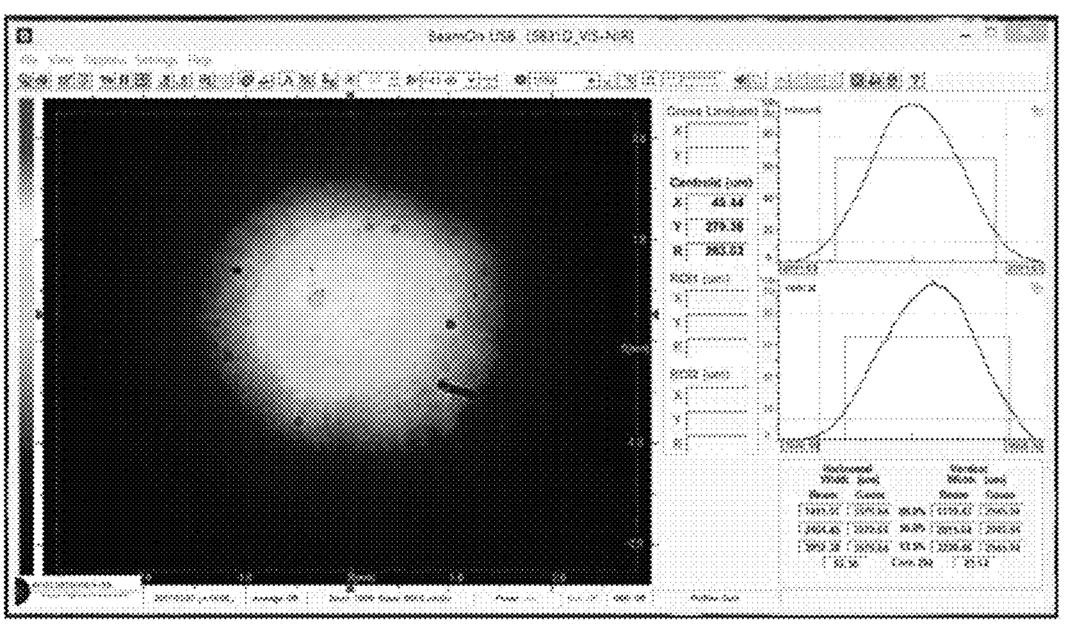

【Fig. 13】
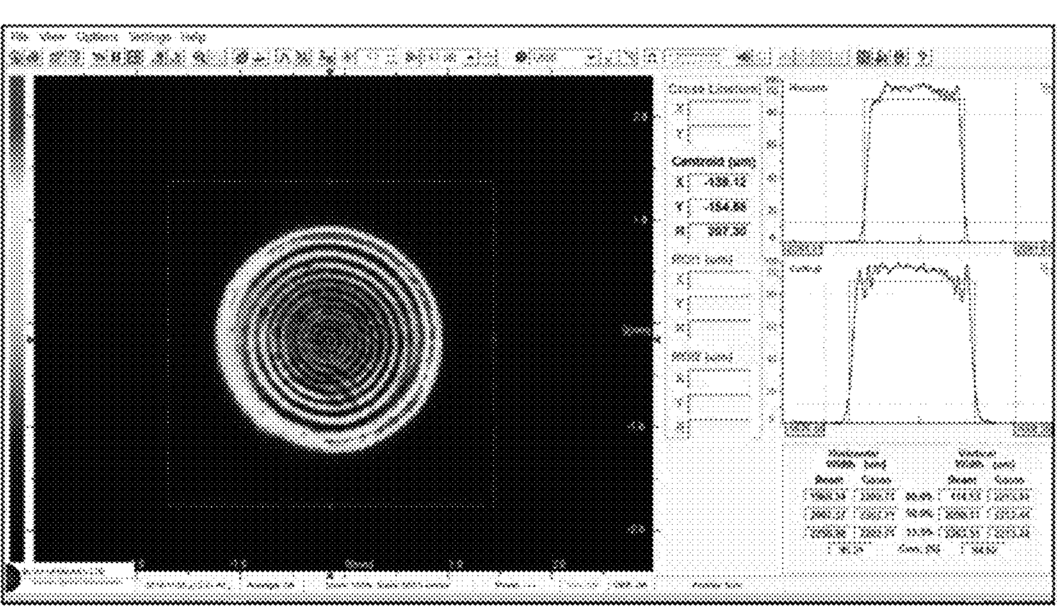

【Fig. 14】
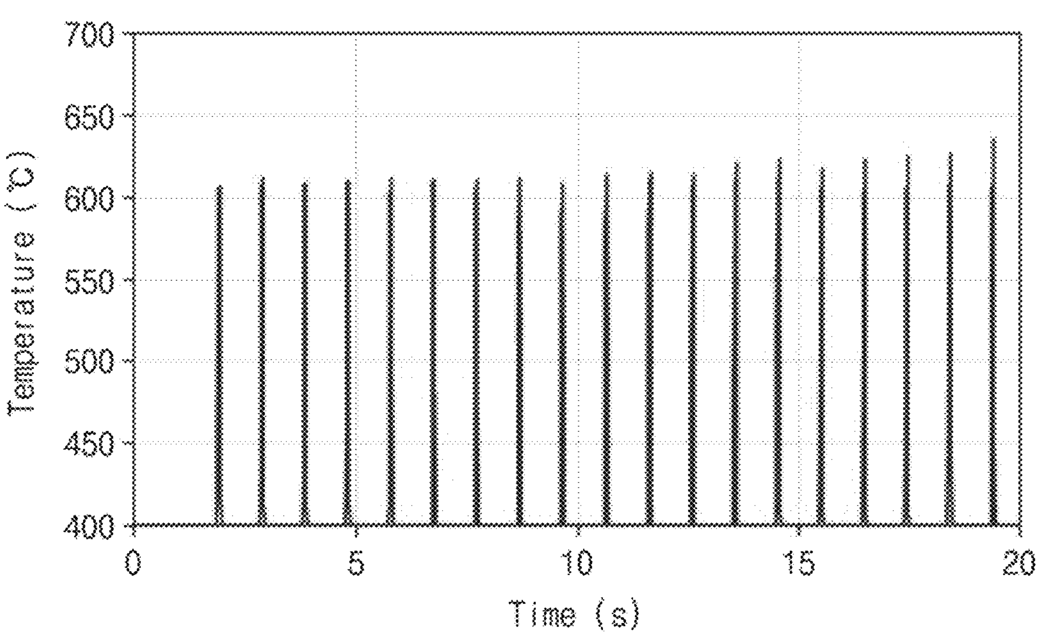

【Fig. 15】
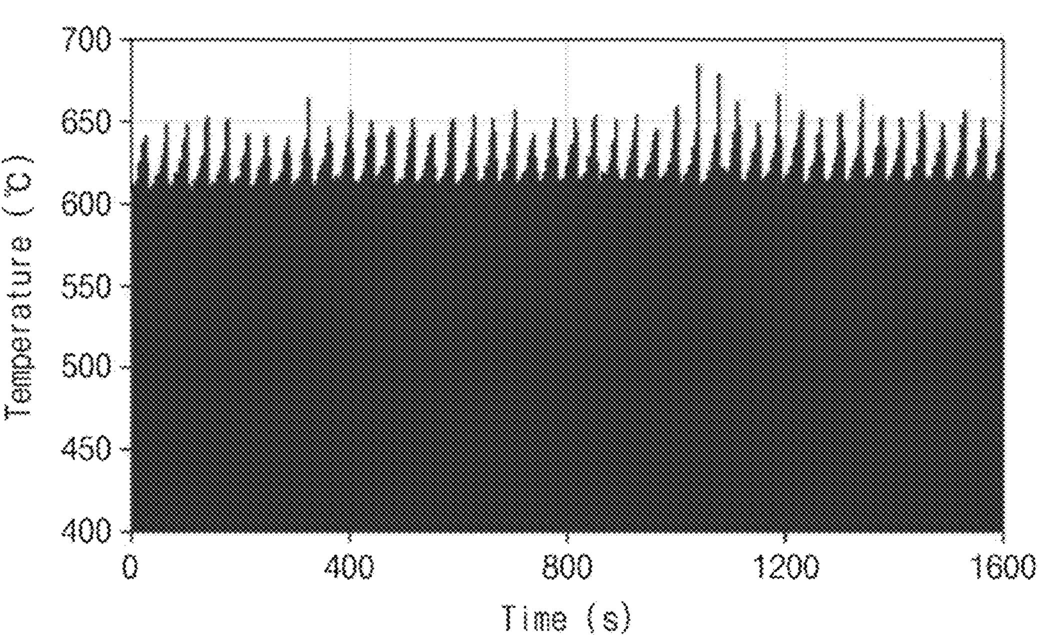

【Fig. 16】
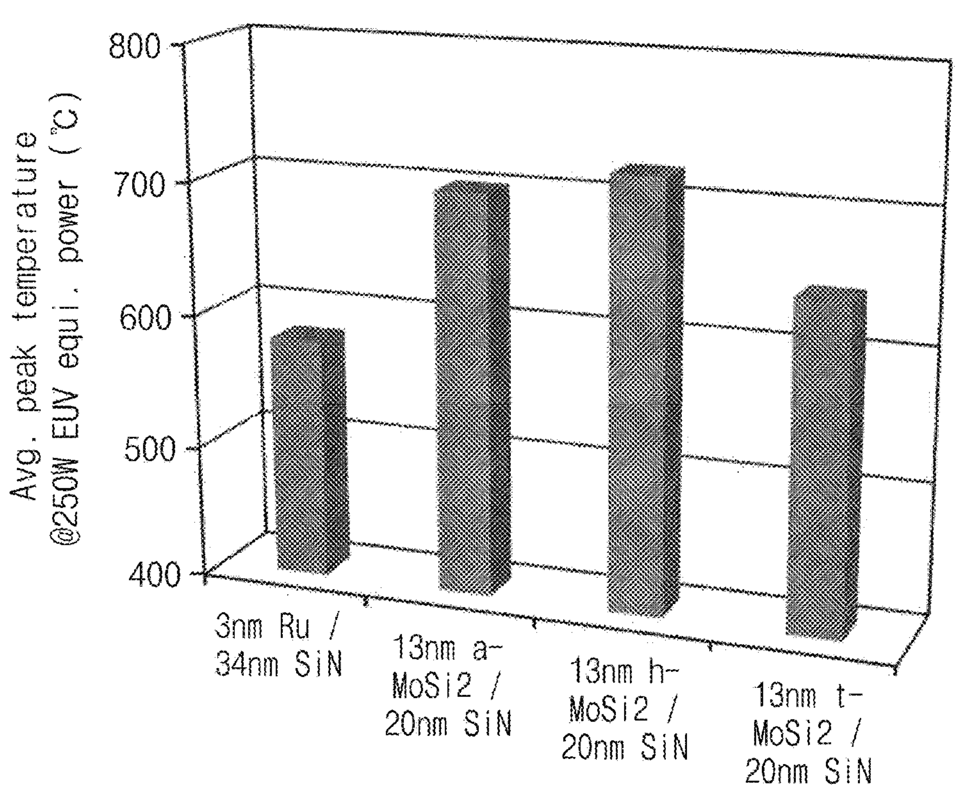

【Fig. 17】
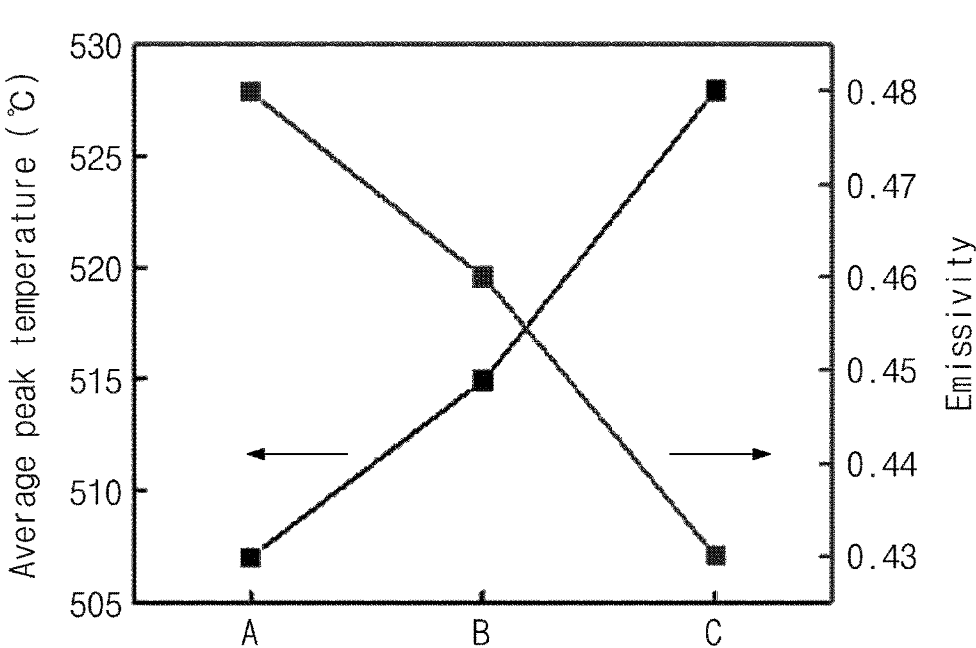

【Fig. 18】

| Experimental # | EUV matched source power | Pellicle-based membrane | EUV absorbance, $A_{EUV}$ | UV absorbance, $A_{UV}$ | UV laser power, $P_{UV}$ (W) | Rotating slit | |
|---|---|---|---|---|---|---|---|
| | | | | | | Heating time | Cooling time |
| 1 | 250W (when $\varphi_{EUV}$ = 5W/cm$^2$) | Metal #1 / SiN | 20% | 30% | 0.94 | 100ms | 900ms |
| 2 | | Metal #2 / SiN | 15% | 25% | 0.85 | 100ms | 900ms |
| 3 | | Ceramics #1 / SiN | 15% | 20% | 1.06 | 100ms | 900ms |
| 4 | | Ceramics #2 / SiN | 10% | 15% | 0.94 | 100ms | 900ms |

【Fig. 19】

| Experimental # | EUV matched source power (UV laser) | Acceleration | $H_2$ flow | H* flow | Rotating slit | |
|---|---|---|---|---|---|---|
| | | | | | Heating time | Cooling time |
| 1 | 250W | X | O | X | 100ms | 900ms |
| 2 | | O | O | X | 100ms | 900ms |
| 3 | | O | O | O | 100ms | 900ms |
| 4 | | O | O | X | 50ms | 450ms |
| 5 | | O | O | X | 25ms | 225ms |

PELLICLE HOLDING MODULE, PELLICLE THERMAL DURABILITY EVALUATION DEVICE COMPRISING SAME, AND PELLICLE THERMAL DURABILITY EVALUATION METHOD

TECHNICAL FIELD

The present invention relates to a pellicle holding module, a pellicle thermal durability evaluation device including the same, and a pellicle thermal durability evaluation method, and more particularly, to a pellicle holding module, a pellicle thermal durability evaluation device including the same, and a pellicle thermal durability evaluation method to evaluate thermal durability of a pellicle by irradiating light to a pellicle holder disposed in a chamber.

BACKGROUND ART

Recently, the extreme ultraviolet (EUV) exposure technology has been applied to the mass production process of semiconductor chips, and it is required to develop a pellicle for preventing the inflow of contaminants generated during the process to prevent a mask from being contaminated in order to improve the yield and productivity of the process. Since EUV light having a wavelength of 13.5 nm used in the EUV exposure process has the characteristic of being absorbed into most materials, an exposure machine has a reflective optical system structure, unlike conventionally used DUV light having a wavelength of 193 nm.

Accordingly, when a pellicle is applied, EUV light passes through the pellicle twice. Thus, the pellicle is manufactured to have a thickness of several tens of nm to have high transmittance of EUV light in order to prevent productivity degradation. Simultaneously, thermal durability as well as mechanical and chemical properties is required to be secured in order to prevent the pellicle from being destroyed during the exposure process. Due to the high vacuum environment inside the exposure machine and the thin thickness of the pellicle during the exposure process, cooling of the heated pellicle is achieved only by thermal emission, and accordingly, the thermal durability of the pellicle is mainly determined by thermal emissivity of a material. However, a standardized evaluation technique for thermal emissivity and thermal durability of thin films has not yet been established. In particular, because the thermal durability evaluation using EUV light has technical and costly problems in realizing high light source output, it is necessary to develop an evaluation method using light of a different wavelength range.

Accordingly, the inventors of the present invention have developed a device and a method for evaluating the thermal durability of a pellicle for an extreme ultraviolet exposure process using light other than EUV light.

DISCLOSURE

Technical Problem

One technical problem to be solved by the present invention is to provide a pellicle holding module, a pellicle thermal durability evaluation device including the same, and a pellicle thermal durability evaluation method, to evaluate the thermal durability of a pellicle for EUV light without using the EUV light.

Another technical problem to be solved by the present invention is to provide a pellicle holding module, a pellicle thermal durability evaluation device including the same, and a pellicle thermal durability evaluation method, to evaluate a lifespan of a pellicle.

Still another technical problem to be solved by the present invention is to provide a pellicle holding module, a pellicle thermal durability evaluation device including the same, and a pellicle thermal durability evaluation method, to evaluate the thermal durability of a pellicle by using simplified equipment and reduced cost.

Still another technical problem to be solved by the present invention is to provide a pellicle holding module, a pellicle thermal durability evaluation device including the same, and a pellicle thermal durability evaluation method, to exclude using EUV lithography process equipment upon evaluating the pellicle thermal durability.

Still another technical problem to be solved by the present invention is to provide a pellicle holding module, a pellicle thermal durability evaluation device including the same, and a pellicle thermal durability evaluation method, to have improved reliability of pellicle thermal durability evaluation.

The technical problems to be solved by the present invention are not limited to the above description.

Technical Solution

In order to solve the above-mentioned technical problems, the present invention provides a pellicle thermal durability evaluation device.

According to one embodiment, the pellicle thermal durability evaluation device includes: a durability measurement unit including a chamber, a pellicle holder disposed in the chamber and on which the pellicle is seated, and a temperature measurement module for measuring a temperature of the pellicle seated on the pellicle holder; and a light source unit for controlling intensity of light according to a type of the pellicle seated on the pellicle holder to irradiate the pellicle with the light.

According to one embodiment, the light may have a wavelength range of 193 nm or more.

According to one embodiment, the thermal durability of the pellicle may be evaluated by measuring a temperature of the pellicle according to a thermal load absorbed by the pellicle.

According to one embodiment, the light source unit may include a light source for irradiating the light, a first light control module for controlling intensity of the light irradiated from the light source, a second light control module for controlling a size of light irradiated from the light source, and a third light control module for controlling intensity distribution of the light irradiated from the light source.

According to one embodiment, the light source unit may further include a first reflection module for reflecting the light controlled through the first to third light control modules, a second reflection module for reflecting the light reflected from the first reflection module, and a light measurement module for receiving the light reflected from the second reflection module to measure intensity of the light, wherein a part of the light reflected from the first reflection module may be provided to the pellicle, and another part of the light reflected from the first reflection module may be provided to the second reflection module.

According to one embodiment, the chamber may include an inlet through which hydrogen ($H_2$) gas is introduced.

According to one embodiment, the light source unit may include a rotating slit for controlling a time when the pellicle is exposed to the light by controlling the light, which is irradiated to the pellicle, in a pulse form.

According to one embodiment, the pellicle holder may be moved in a first direction and a second direction perpendicular to the first direction.

In order to solve the above-mentioned technical problems, the present invention provides a pellicle thermal durability evaluation method.

According to one embodiment, the pellicle thermal durability evaluation method includes: seating a pellicle on a pellicle holder disposed in a chamber; calculating intensity of light irradiated to the pellicle according to a type of the pellicle; controlling the intensity of the light with the calculated intensity of the light to irradiate the controlled light to the pellicle; and measuring a temperature of the pellicle.

According to one embodiment, the method further includes: calculating a thermal load absorbed by the pellicle, after the irradiating of the light to the pellicle and before the measuring of the temperature of the pellicle, wherein, in the measuring of the temperature of the pellicle, the temperature of the pellicle may be measured according to the thermal load absorbed by the pellicle.

According to one embodiment, the method may further include deriving thermal emissivity of the pellicle, after the measuring of the temperature of the pellicle, wherein the thermal emissivity of the pellicle may be derived through Equation 3 below using the thermal load density absorbed by the pellicle.

$$\frac{dT}{dt} = \frac{1}{c \cdot m} \cdot \left[H \cdot S - \varepsilon \cdot \sigma \cdot S \cdot \left(T^4 - T_s^4\right)\right] \quad \text{<Equation 3>}$$

(c: specific heat, m: mass of pellicle, α: absorbance of pellicle for light, S: heat dissipation area, σ: Stefan-Boltzmann constant, T: temperature of pellicle, $T_s$: ambient temperature, H: thermal load density absorbed by pellicle, ε: thermal emissivity of pellicle)

According to one embodiment, the calculating of the intensity of the light irradiated to the pellicle may include calculating the intensity of the light irradiated to the pellicle by providing absorbance data of the pellicle for the light to a database containing intensity data of extreme ultraviolet (EUV) and absorbance data of the pellicle for EUV.

In order to solve the above-mentioned technical problems, the present invention provides a pellicle holding module.

According to one embodiment, the pellicle holding module includes: a first stage including a first guide rail extending in a first direction; a second stage disposed on the first guide rail, moved in the first direction, and including a second guide rail extending in a second direction perpendicular to the first direction; and a pellicle holder disposed on the second guide rail and moved in the second direction, and including a plurality of receiving grooves in which pellicles are seated, wherein the pellicle seated in the receiving groove is moved in the first direction and the second direction along the first guide rail and the second guide rail.

According to one embodiment, the receiving groove may includes a first region and a second region having a step, in which the second region has a width narrower than a width of the first region, the pellicle is seated in the first region of the receiving groove, and the second region of the receiving groove remains as an empty space when the pellicle is seated in the first region of the receiving groove.

Advantageous Effects

The pellicle thermal durability evaluation device according to the embodiment of the present invention includes: a durability measurement unit including a chamber, a pellicle holder disposed in the chamber and on which the pellicle is seated, and a temperature measurement module for measuring a temperature of the pellicle seated on the pellicle holder; and a light source unit for controlling intensity of light having a wavelength of 193 nm or more according to a type of the pellicle seated on the pellicle holder to irradiate the pellicle with the light, wherein the thermal durability of the pellicle may be evaluated by measuring the temperature of the pellicle according to the thermal load absorbed by the pellicle.

In addition, the pellicle thermal durability evaluation device according to the embodiment controls the intensity of the light according to the type of the pellicle, in which an intensity condition of EUV to be evaluated and absorbance of the pellicle for EUV may be considered in controlling the intensity of the light.

Thus, the thermal durability of the pellicle may be evaluated through light (for example, ultraviolet light) other than EUV light that causes technical and costly problems in light output, so that a pellicle thermal durability evaluation device having a simplified equipment configuration and reduced in cost can be provided. In addition, the EUV lithography process equipment may not be used directly, so that the EUV lithography process equipment can be prevented from being damaged and contaminated and the equipment utilization efficiency can be improved.

In addition, according to the pellicle thermal durability evaluation device of the embodiment, hydrogen ($H_2$) gas is provided into the chamber, the pellicle holder seated thereon with the pellicle is moved in the first direction and the second direction perpendicular to the first direction, and the exposure time of the light provided to the pellicle is controlled, so that an actual EUV lithography process environment can be created. Accordingly, reliability of the thermal durability evaluation of the pellicle can be improved.

DESCRIPTION OF DRAWINGS

FIG. 1 is a view showing a pellicle thermal durability evaluation device according to the embodiment of the present invention.

FIG. 2 is a view showing a durability measurement unit included in the pellicle thermal durability evaluation device according to the embodiment of the present invention.

FIG. 3 is a view showing a rotating slit included in the durability measurement unit according to the embodiment of the present invention.

FIG. 4 is a view showing operations of the rotating slit included in the durability measuring unit according to the embodiment of the present invention.

FIG. 5 is a view showing the durability measurement unit included in the thermal durability evaluation device according to the embodiment of the present invention.

FIG. 6 is a perspective view showing a pellicle holding module included in the durability measurement unit according to the embodiment of the present invention.

FIG. 7 is a plan view of the pellicle holding module included in the durability measurement unit according to the embodiment of the present invention.

FIG. 8 is a view showing a pellicle seated on the pellicle holding module according to the embodiment of the present invention.

FIG. 9 is a sectional view showing a receiving groove included in the pellicle holding module according to the embodiment of the present invention.

FIG. 10 is a view showing a state in which the pellicle is seated in the pellicle holding module according to the embodiment of the present invention.

FIG. 11 is a flow chart explaining a pellicle thermal durability evaluation method according to the embodiment of the present invention.

FIGS. 12 and 13 are photographs and graphs showing results by appying a third light control module included in the pellicle thermal durability evaluation device according to the embodiment of the present invention.

FIGS. 14 and 15 are graphs showing results of evaluating the thermal durability of the pellicle through the pellicle thermal durability evaluation device according to the embodiment of the present invention.

FIG. 16 is a graph comparing results of evaluating the thermal durability of different pellicles through the pellicle thermal durability evaluation device according to the embodiment of the present invention.

FIG. 17 is a graph showing results of calculating the thermal emissivity of the pellicle through the pellicle thermal durability evaluation device according to the embodiment of the present invention.

FIG. 18 is a table showing temperature evaluation results according to thermal loads for pellicles having different structures through the pellicle thermal durability evaluation device according to the embodiment of the present invention.

FIG. 19 This a table showing results of experiments with different thermal evaluation conditions for the same pellicle through the pellicle thermal durability evaluation device according to the embodiment of the present invention.

BEST MODE

Mode for Invention

Hereinafter, preferred embodiments of the present invention will be described in detail with reference to the accompanying drawings. However, the technical idea of the present invention is not limited to the exemplary embodiments described herein and may be embodied in other forms. Further, the embodiments are provided to enable contents disclosed herein to be thorough and complete and provided to enable those skilled in the art to fully understand the idea of the present invention.

In the specification herein, when one component is mentioned as being on other component, it signifies that the one component may be placed directly on the other component or a third component may be interposed therebetween. In addition, in drawings, thicknesses of layers and areas may be exaggerated to effectively describe the technology of the present invention.

In addition, although terms such as first, second and third are used to describe various components in various embodiments of the present specification, the components will not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it will be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

Figure 1:
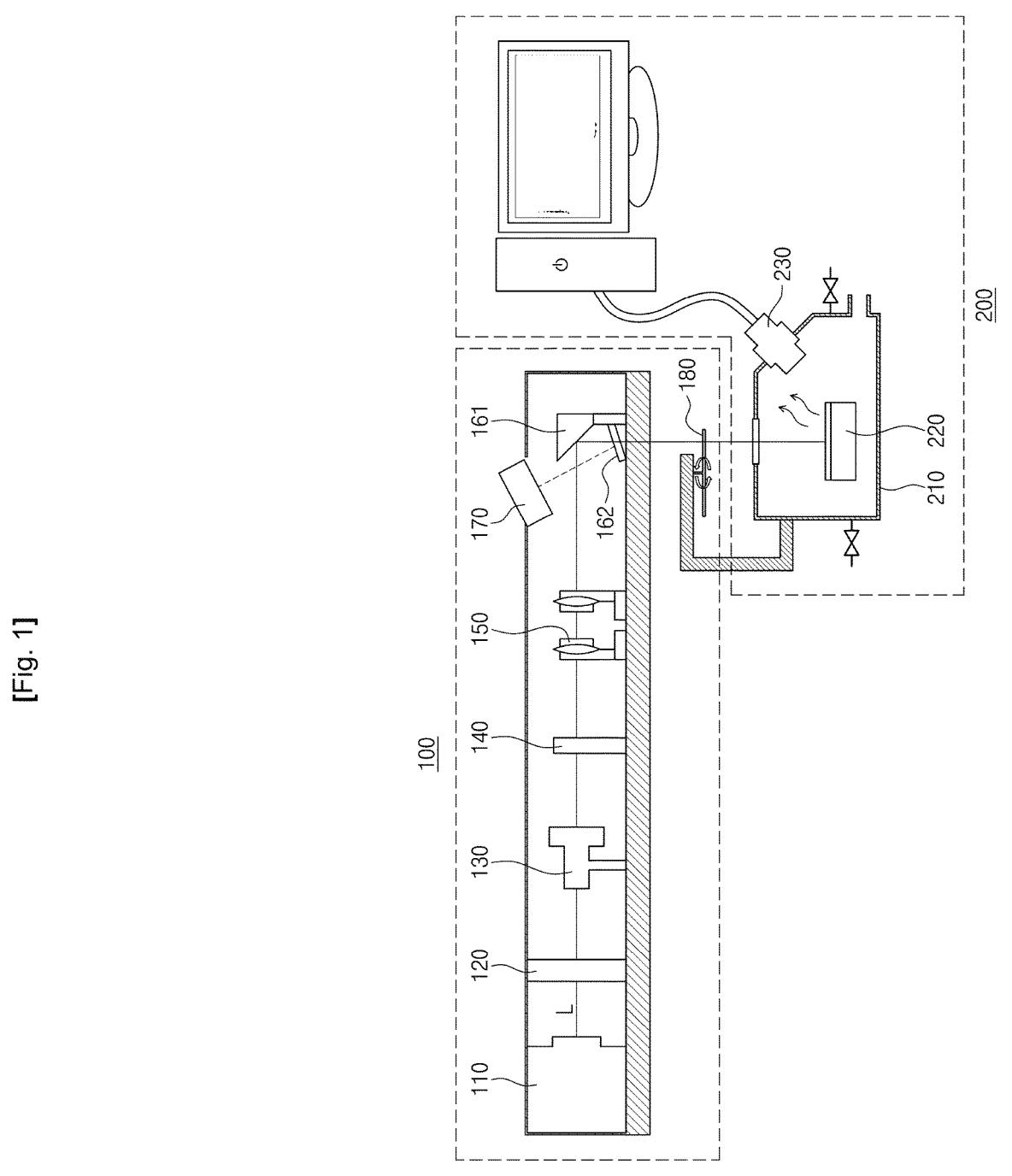

FIG. 1 is a view showing a pellicle thermal durability evaluation device according to the embodiment of the present invention. FIG. 2 is a view showing a durability measurement unit included in the pellicle thermal durability evaluation device according to the embodiment of the present invention. FIG. 3 is a view showing a rotating slit included in the durability measurement unit according to the embodiment of the present invention. FIG. 4 is a view showing operations of the rotating slit included in the durability measuring unit according to the embodiment of the present invention.

Referring to FIG. 1, the pellicle thermal durability evaluation device according to the embodiment of the present invention may include: a light source unit 100 for irradiating light to a pellicle for extreme ultraviolet (EUV) lithography;

and a durability measurement unit 200 for measuring thermal durability of the pellicle through the light irradiated to the pellicle. Hereinafter, each configuration will be described in detail.

Light Source Unit 100

Referring to FIG. 2, the light source unit 100 may include a light source 110, a first light control module 120, a second light control module 130, a third light control module 140, a light-condensing module 150, a first reflection module 161, a second reflection module 162, an intensity measurement module 170, and a rotating slit 180.

The light source 110 may irradiate light L. The light L irradiated from the light source 110 may be provided to the durability measurement unit 200 via the first light control module 120, the second light control module 130, the third light control module 140, the condensing module 150, the first reflection module 161, and the rotating slit 180.

According to one embodiment, the light L irradiated from the light source 110 may have a wavelength range different from a wavelength range of EUV light. More specifically, the light L may have a wavelength range of 193 nm or more (such as 335 nm, 434 nm, 532 nm, 810 nm, or 1014 nm). For example, the light L irradiated from the light source 110 may include ultraviolet (UV) or visible light.

As described above, the light irradiated from the light source 110 may be provided to the light-condensing module 150 after sequentially passing through the first light control module 120, the second light control module 130, and the third light control module 140. The first to third light control modules 120, 130 and 140 may control the intensity, size and intensity distribution of the light L.

The first light control module 120 may control the intensity of the light L. For example, the first light control module 120 may include an attenuator. The first light control module 120 may control the light L according to a type of a pellicle seated on the durability measurement unit 200 described later. More specifically, the intensity of the light L controlled according to the type of the pellicle may be calculated through Equation 1 below by considering intensity of EUV to be evaluated, absorbance of the pellicle for EUV, and absorbance of the pellicle for the light.

$$\Phi^{*}_{EUV} A_{EUV} = \Phi_L * A_L$$ < Equation 1 >

(PEW: intensity of EUV, $A_{EUV}$: absorbance of pellicle for EUV, $\Phi_L$: intensity of the light, $A_L$: absorbance of the pellicle for the light)

On the contrary, the second light control module 130 may control a size of the light L. For example, the second light control module 130 may include a beam expander.

On the contrary, the third light control module 140 may control the intensity distribution of the light L. For example, the third light control module 140 may include diffractive optics elements (DOE). More specifically, the third light control module 140 may calibrate a Gaussian distribution (the distribution with the highest center) to a top-hat distribution (the distribution that is uniform as a whole).

The light L having controlled intensity, size, and intensity distribution may be provided to the first reflection module 161 via the light-condensing module 150 through the first to third light control modules 120, 130 and 140. For example, the light-condensing module 150 may include a focusing lens.

The first reflection module 161 may reflect the light L provided from the light-condensing module 150. The light L reflected from the first reflection module 161 may be provided to the second reflection module 162 and the pellicle seated in the durability measurement unit 200 described later.

More specifically, the light L reflected from the first reflection module 161 may be provided to the second reflection module 162. The second reflection module 162 may reflect a part of the light L again and may transmit the remaining part. The light L reflected from the second reflection module 162 may be provided to the intensity measurement module 170. Accordingly, the intensity of the light L irradiated to the pellicle seated in the durability measurement unit 200 described later may be measured in real time.

On the contrary, the remaining part of the light L transmitted through the second reflection module 162 may be provided to the pellicle seated in the durability measurement unit 200 described later, after passing through the rotating slit 180.

The rotating slit 180 may control a time when the pellicle is exposed to the light L by controlling the light L, which is irradiated to the pellicle, in a pulse form. For example, the rotating slit 180 may control the time during which the pellicle is exposed to the light L and the time during which the pellicle is not exposed to the light L at the ratio of 1:9 (exposure time: non-exposure time). Accordingly, an environment similar to an actual EUV lithography process may be created.

According to one embodiment, as shown in FIG. 3, the rotating slit 180 may have a disc shape, have a form having a partial region opened inward from an outer circumferential surface of the disc shape, and be rotated clockwise or counterclockwise around the normal of a center of the disc. Accordingly, as shown in FIG. 4, when being irradiated to the opened part of the disc, the light L may be provided to the pellicle seated in the durability measurement unit 200 described later after passing through the rotating slit 180. Whereas, when being irradiated to the unopened part of the disc, the light L may be blocked by the rotating slit 180 and prevented from being provided to the pellicle seated in the durability measurement unit 200.

Unlike the above description, according to another embodiment, another part of the light L reflected from the first reflection module 161 may be provided to the pellicle seated in the durability measurement unit 200 described later after being controlled in the form of a pulse through equipment such as a shutter. In other words, before another part of the light L reflected from the first reflection module 161 is provided to the pellicle seated in the durability measurement unit 200 described later, a type of equipment capable of controlling the light L in the pulse form is not limited.

Durability Measurement Unit 200

FIG. 5 is a view showing the durability measurement unit included in the thermal durability evaluation device according to the embodiment of the present invention. FIG. 6 is a perspective view showing a pellicle holding module included in the durability measurement unit according to the embodiment of the present invention. FIG. 7 is a plan view of the pellicle holding module included in the durability measurement unit according to the embodiment of the present invention. FIG. 8 is a view showing a pellicle seated on the pellicle holding module according to the embodiment of the present invention. FIG. 9 is a sectional view showing a receiving groove included in the pellicle holding module according to the embodiment of the present invention. FIG. 10 is a view showing a state in which the pellicle is seated in the pellicle holding module according to the embodiment of the present invention.

Referring to FIG. 5, the durability measurement unit 200 may include a chamber 210, a pellicle holding module 220, and a temperature measurement module 230. Hereinafter, each configuration will be described in detail.

The chamber 210 may include a plurality of inlets. According to one embodiment, the chamber 210 may include a first inlet 210*a*, a second inlet 210*b*, and a third inlet 210*c*. The first inlet 210*a* may be connected to a vacuum pump. Accordingly, the inside of the chamber 210 may be maintained in a vacuum state through the first inlet 210*a*.

The second inlet 210*b* may introduce hydrogen ($H_2$) gas into the chamber 210. In the actual EUV lithography process, hydrogen gas is introduced into an exposure machine for cleaning purpose, and thus, the hydrogen gas may be introduced into the chamber 210, so that an environment similar to the actual EUV lithography process may be created. On the contrary, the third inlet 210*c* may introduce nitrogen ($N_2$) gas into the chamber 210.

According to one embodiment, the second inlet 210*b* and the third inlet 210*c* may be connected to a first valve 211 and a second valve 212, respectively. The first valve 211 may control the flow rate of hydrogen gas supplied into the chamber 210 through the second inlet 210*b*, and the second valve 212 may control the flow rate of nitrogen gas supplied into the chamber 210 through the third inlet 210*c*.

A quartz window 213 may be disposed at the tpo of the chamber 210. The light L passing through the rotating slit 180 included in the light source unit 100 may be introduced into the chamber 210 through the quartz window 213, so as to be provided to the pellicle P seated in the pellicle holding module 200 described later. In addition, a response and a presence of destruction of the pellicle P disposed in the chamber 210 may be easily checked through the quartz window 213.

Referring to FIGS. 5 to 7, the pellicle holding module 220 may be disposed inside the chamber 210. The pellicle holding module 220 may include a first stage 221, a second stage 222, and a pellicle holder 223.

The first stage 221 may include a first guide rail R1 and a first motor M1. According to one embodiment, the first guide rail R1 may extend in the first direction. For example, the first direction may be an X-axis direction shown in FIGS. 6 and 7. The first motor M1 may provide motive power such that the second stage 222 described later linearly reciprocates in the first direction (X-axis direction) along the first guide rail R1.

The second stage 222 may include a second guide rail R2 and a second motor M2. According to one embodiment, the second guide rail R2 may extend in a second direction perpendicular to the first direction (X-axis direction). For example, the second direction may be an Y-axis direction shown in FIGS. 6 and 7. The second motor M2 may provide motive power such that the pellicle holder 223 described later linearly reciprocates in the second direction (Y-axis direction) along the second guide rail R2.

The second stage 222 may be disposed on the first stage 221. More specifically, the second stage 222 may be disposed on the first guide rail R1 included in the first stage 221. Accordingly, as described above, the second stage 222 may linearly reciprocate in the first direction (X-axis direction) along the first guide rail R1.

The pellicle holder 223 may be disposed on the second stage 222. More specifically, the pellicle holder 223 may be disposed on the second guide rail R2 included in the second stage 222. Accordingly, as described above, the pellicle holder 223 may linearly reciprocate in the second direction (Y-axis direction) along the second guide rail R2. In addition, the pellicle holder 223 may linearly reciprocate in the first direction (X-axis direction) along the first guide rail R1 together with the second stage 222.

As a result, the pellicle holder 223 may be moved in the first direction (X-axis direction) and the second direction (Y-axis direction) along the first guide rail R1 and the second guide rail R2. Accordingly, the thermal durability of the pellicle P seated on the pellicle holder 223 can be evaluated in an environment similar to the actual EUV lithography process environment.

The pellicle holder 223 may include a plurality of receiving grooves GV. The pellicle P may be disposed in the receiving groove GV. According to one embodiment, as shown in FIG. 8, the pellicle P may include a pellicle frame PF and a pellicle membrane PM disposed on the pellicle frame PF.

The receiving grooves GV may be arranged two-dimensionally in rows and columns, and a plurality of pellicles P may be disposed in the receiving grooves GV, respectively.

Referring to FIGS. 9 and 10, the receiving groove GV may include a first region A1 and a second region A2 having steps. The second region A2 may be provided in the first region A1, and a bottom surface of the second region A2 may be positioned at a level lower than a bottom surface of the first region A1. According to one embodiment, the first region A1 may have a first width W1 similar to a width of the pellicle P, and the second region A2 may have a second width W2 narrower than the width of the pellicle P. In other words, the second width W2 may be narrower than the first width W1. Accordingly, when the pellicle P is seated in the receiving groove GV, the pellicle P may be seated in the first region A1 of the receiving groove GV. Whereas, the second region A2 and a part of the first region A1 of the receiving groove GV may remain as empty spaces.

Accordingly, when the pellicle P is seated in the receiving groove GV or the pellicle P in a seated state is separated from the receiving groove GV, a pressure applied to the pellicle P may be distributed to the second region A2 and the first region A1 remaining as the empty spaces, so that the damage problem of the pellicle P can be solved. In addition, the second region A2 and the first region A1 remain empty while the pellicle P is seated in the receiving groove GV, so that heat by the light L applied to the pellicle P may be easily released.

In addition, the pellicle holder 233 may include a plurality of extension grooves LV extending side by side in the first direction (x-axis direction). The extension groove LV may traverse the receiving grooves GV. Specifically, as shown in FIG. 6, one extension groove LV may be arranged across the receiving grooves GV arranged in the first direction. In addition, a bottom surface of the extension groove LV may be positioned at a level lower than the bottom surface of the first region A1, and positioned at a level higher than the bottom surface of the second region A2. Accordingly, when the pellicle P is seated in the receiving groove GV or separated from the receiving groove GV, the damage to the pellicle P can be minimized.

The temperature measurement module 230 may measure a temperature of the pellicle P irradiated with the light L.

Accordingly, the thermal durability of the pellicle P can be evaluated. According to one embodiment, the thermal durability of the pellicle P may be evaluated by measuring the temperature of the pellicle P according to the thermal load absorbed by the pellicle P. For example, the temperature measurement module 230 may include a two-channel (2-ch) pyrometer.

More specifically, the thermal load density absorbed by the pellicle P may be calculated through Equation 2 below by considering the total intensity power of the light L, the irradiated area of the light L, and the absorbance of the pellicle P for the light L.

$$\frac{P_L}{D_L} * A_L = I_{abs} \qquad \text{<Equation 2>}$$

($P_L$: total intensity power of the light, $D_L$: irradiated area of the light, $A_L$: absorbance of the pellicle for the light, $I_{abs}$: thermal load density absorbed by pellicle)

As described above, each of the intensity PL of the light L and the size DL of the light L is controlled through the first light control module 120 and the second light control module 130 included in the light source unit 100 and accordingly, may be checked through the first and second light control modules 120 and 130. According to one embodiment, the absorbance AL of the pellicle P for the light L may be measured through a spectrophotometer. For example, when the light L is ultraviolet (UV), the absorbance AL of the pellicle (P) may be measured through a UV/VIS spectrophotometer.

As confirmed in Equation 1 above, the intensity PL of the light L may be calculated by considering the intensity of EUV and the absorbance of the pellicle P for EUV. Accordingly, although EUV light is not directly used as the light L, the thermal load absorbed by the pellicle P may simulate the thermal load received by the pellicle during the actual EUV lithography process.

In addition, the durability measurement unit 200 may derive thermal emissivity of the pellicle P. Since cooling of the pellicle during the actual EUV lithography process is mainly performed by thermal emission, thermal emissivity data of the pellicle may be primarily used to determine the thermal durability of the pellicle. In the related art, it is difficult to comprehend thermal emissivity data of an ultra-thin film having a thickness of several tens of nm in the literature, and there is no standardized method for measuring the thermal emissivity data.

However, the durability measurement unit 200 may derive thermal emissivity by using the thermal load absorbed by the pellicle P. The thermal emissivity of the pellicle P may be calculated through Equation 3 below that excludes heat conduction and convection and considers the effect of heat emission. Accordingly, a heat emissivity database according to the type of the pellicle P can be easily constructed.

$$\frac{dT}{dt} = \frac{1}{c \cdot m} \cdot \left[H \cdot S - \varepsilon \cdot \sigma \cdot S \cdot \left(T^4 - T_s^4\right)\right]$$ <Equation 3>

(c: specific heat, m: mass of the pellicle, α: absorbance of the pellicle for the light, S: heat dissipation area, σ: Stefan-Boltzmann constant, T: temperature of the pellicle, $T_s$: ambient temperature, H: thermal load density absorbed by the pellicle, ε: thermal emissivity of the pellicle)

When the durability of a pellicle is directly evaluated using EUV lithography process equipment, destruction of a pellicle film during evaluation may cause serious contamination onto expensive EUV lithography process equipment. In addition, it is inefficient to directly evaluate the durability of the pellicle by using the EUV lithography process equipment, when considering cleaning costs due to the destruction of the thin film and costs by damages caused by the process stoppage during the cleaning time.

However, the pellicle thermal durability evaluation device according to the embodiment of the present invention includes the durability measurement unit 200 including a chamber 210, a pellicle holder 223 disposed in the chamber 210 and on which the pellicle P is seated, and a temperature measurement module 230 for measuring a temperature of the pellicle P seated in the pellicle holder 223; and the light source unit 100 for controlling intensity of the light having a wavelength of 193 nm or more according to a type of the pellicle P seated in the pellicle holder 223 to irradiate the pellicle with the light, wherein the thermal durability of the pellicle P may be evaluated by measuring the temperature of the pellicle P according to the thermal load absorbed by the pellicle P.

In addition, the pellicle thermal durability evaluation device according to the embodiment controls the intensity of the light L according to the type of the pellicle P, in which an intensity condition of EUV to be evaluated and absorbance of the pellicle P for EUV may be considered in controlling the intensity of the light L.

Accordingly, the thermal durability of the pellicle P may be evaluated through light (for example, ultraviolet light) other than EUV light that causes technical and costly problems in light output, so that the pellicle thermal durability evaluation device having a simplified equipment configuration and reduced in cost can be provided. In addition, the EUV lithography process equipment may not be used directly, so that the EUV lithography process equipment can be prevented from being damaged and contaminated and the equipment utilization efficiency can be improved.

In addition, according to the pellicle thermal durability evaluation device of the embodiment, hydrogen ($H_2$) gas is provided into the chamber 210, the pellicle holder 223 on which the pellicle P is seated is moved in the first direction (X-axis direction) and the second direction (Y-axis direction), and the exposure time of the light L provided to the pellicle P is controlled, so that an actual EUV lithography process environment can be created. Accordingly, reliability of the thermal durability evaluation of the pellicle P can be improved.

The pellicle thermal durability evaluation device according to the embodiment of the present invention have been described. Hereinafter, a pellicle thermal durability evaluation method according to the embodiment of the present invention will be described, the pellicle thermal durability evaluation device according to the embodiment described with reference to FIGS. 1 to 10 may be applied as an example for describing the pellicle thermal durability evaluation method.

FIG. 11 is a flow chart explaining a pellicle thermal durability evaluation method according to the embodiment of the present invention.

Referring to FIG. 11, the pellicle P may be seated on the pellicle holding module 220 disposed in the chamber 210 (S100). According to one embodiment, the pellicle P may include a pellicle frame PF and a pellicle membrane PM disposed on the pellicle frame PF. the pellicle holding module 220 includes a first stage 221, a second stage 222 disposed on the first stage 221, and a pellicle holder 223 disposed on the second stage 222, in which the pellicle P may be seated on the pellicle holder 223.

As described with reference to FIGS. 9 and 10, the pellicle holder 223 may include a plurality of receiving grooves GV, and the receiving groove GV may include a first region A1 and a second region A2 having a step. More specifically, the pellicle P may be seated in the first region A1 of the receiving groove GV. The first region A1 may have a first width W1 similar to a width of the pellicle P, and the second region A2 may have a second width W2 narrower than the width of the pellicle P. Thus, when the pellicle P is seated in the first region A1, the second region A2 and a part of the first region A1 may remain as empty spaces.

Accordingly, when the pellicle P is seated in the receiving groove GV or the pellicle P in a seated state is separated from the receiving groove GV, a pressure applied to the pellicle P may be distributed to the second region A2 and the first region A1 remaining as the empty spaces, so that the damage problem of the pellicle P can be solved. In addition, the second region A2 and the first region A1 remain empty while the pellicle P is seated in the receiving groove GV, so that heat by the light L applied to the pellicle P may be easily released.

According to one embodiment, the pellicle holder 223 may be moved in the first direction (X-axis direction) and the second direction (Y-axis direction) by a first guide rail R1 included in the first stage 221 and a second guide rail R2 included in the second stage 222. Accordingly, the thermal durability of the pellicle P seated on the pellicle holder 223 can be evaluated in an environment similar to the actual EUV lithography process environment.

After the pellicle P is seated, the intensity of the light L irradiated to the pellicle P may be calculated according to the type of the pellicle P (S200). According to one embodiment, the light L irradiated to the pellicle P may have a wavelength range different from a wavelength range of EUV light More specifically, the light L may have a wavelength range of 193 nm or more. For example, the light L irradiated to the pellicle P may include ultraviolet (UV).

The intensity of the light L controlled according to the type of the pellicle P may be calculated through Equation 1 below by considering intensity of EUV, absorbance of pellicle for EUV, and absorbance of the pellicle for the light.

$$\Phi_{EUV}^{*} A_{EUV} = \Phi_L * A_L \quad \text{< Equation 1 >}$$

($\Phi_{EUV}$: intensity of EUV, $A_{EUV}$: absorbance of pellicle for EUV, $\Phi_L$: intensity of the light, $A_L$: absorbance of the pellicle for the light)

According to one embodiment, the intensity of the light L may be calculated by constructing a database containing absorbance data of the pellicle for EUV and absorbance data of the pellicle for the light L and then inputting an EUV intensity value to be evaluated.

After the intensity of the light L is controlled with the calculated intensity of the light L, the controlled light L may be irradiated to the pellicle P (S300). According to one embodiment, after the intensity of the light L is controlled and before the controlled light L is irradiated to the pellicle P, the size and the intensity distribution of the light L may be controlled. In addition, before the light L is irradiated to the pellicle P, the light L may be converted into a pulse form. Thereafter, the light L converted into the pulse form may be provided to the pellicle P. In other words, a time during which the pellicle P is exposed to the light L may be controlled. For example, the pellicle P may be controlled at the ratio of 1:9 (exposure time: non-exposure time) between the time exposed to the light L and the time not exposed. Accordingly, an environment similar to an actual EUV lithography process may be created.

After the light L is irradiated to the pellicle P, a thermal load absorbed by the pellicle P may be calculated (S400). The thermal load absorbed by the pellicle P may be calculated through Equation 2 below by considering the total intensity power of the light L, the irradiated area of the light L, and the absorbance of the pellicle P for the light L.

$$\frac{P_L}{D_L} * A_L = I_{abs} \quad \text{<Equation 2>}$$

(PL: total intensity power of the light, DL: irradiated area of the light, AL: absorbance of the pellicle for the light, Iabs: thermal load density absorbed by pellicle)

As confirmed in Equation 1 above, the intensity PL of the light L may be calculated by considering the intensity of EUV and the absorbance of the pellicle P for EUV. Accordingly, EUV light is not directly used as the light L, however, the thermal load absorbed by the pellicle P may simulate the thermal load received by the pellicle during the actual EUV lithography process.

Finally, the temperature of the pellicle P is measured, so that the thermal durability of the pellicle may be evaluated (S500). According to one embodiment, the thermal durability of the pellicle may be evaluated by measuring the temperature of the pellicle P according to the thermal load absorbed by the pellicle P.

In addition, the pellicle thermal durability evaluation method according to the embodiment may calculate the thermal emissivity of the pellicle P. Since cooling of the pellicle during the actual EUV lithography process is mainly performed by thermal emission, thermal emissivity data of the pellicle may be primarily used to determine the thermal durability of the pellicle. In the related art, it is difficult to comprehend thermal emissivity data of an ultra-thin film having a thickness of several tens of nm in the literature, and there is no standardized method for measuring the thermal emissivity data.

However, the pellicle thermal durability evaluation method according to the embodiment may derive the thermal emissivity by using the thermal load applied to the pellicle P. The thermal emissivity of the pellicle P may be calculated through Equation 3 below that excludes heat conduction and convection and consideres the effect of heat emission. Accordingly, a heat emissivity database according to the type of the pellicle P can be easily constructed.

$$\frac{dT}{dt} = \frac{1}{c \cdot m} \cdot \left[H \cdot S - \varepsilon \cdot \sigma \cdot S \cdot \left(T^4 - T_s^4\right)\right] \quad \text{<Equation 3>}$$

(c: specific heat, m: mass of the pellicle, α: absorbance of the pellicle for the light, S: heat dissipation area, σ: Stefan-Boltzmann constant, T: temperature of the pellicle, $T_s$: ambient temperature, H: thermal load density absorbed by the pellicle, ε: thermal emissivity of the pellicle)

The pellicle thermal durability evaluation method according to the embodiment of the present invention have been described. Hereinafter, results on specific experimental examples characteristic evaluations of the pellicle thermal durability evaluation device according to the embodiment of the present invention will be described.

FIGS. 12 and 13 are photographs and graphs showing results by appying a third light control module included in the pellicle thermal durability evaluation device according to the embodiment of the present invention.

Referring to FIGS. 12 and 13, in the pellicle thermal durability evaluation device according to the embodiment described with reference to FIG. 1, the intensity distribution of light is controlled by the third light control module (for example, diffractive optics elements, DOE), and the results are shown. FIG. 12 shows a state before the intensity distribution is controlled, and FIG. 13 shows a state where the intensity distribution is controlled. As shown in FIGS. 12 and 13, it is confirmed that the light before the intensity distribution of the light is controlled indicates a Gaussian distribution with the highest central portion, but the light after the intensity distribution is controlled indicates a top-hat distribution that is uniform as a whole.

FIGS. 14 and 15 are graphs showing results of evaluating the thermal durability of the pellicle through the pellicle thermal durability evaluation device according to the embodiment of the present invention.

Referring to FIGS. 14 and 15, ultraviolet (UV) is irradiated to the pellicle seated in the pellicle holding module, and the temperature of the pellicle irradiated with ultraviolet is measured and indicated, through the pellicle thermal durability evaluation device according to the embodiment described with reference to FIG. 1. As shown in FIGS. 14 and 15, it is confirmed that the temperature varies according to the time of the ultraviolet (UV) irradiated to the pellicle. Accordingly, it is found that the thermal durability of the pellicle can be evaluated through the pellicle thermal durability evaluation device. In addition, it is found that a lifespan of the pellicle can also be evaluated indirectly by performing the pellicle thermal durability evaluation for a long time.

FIG. 16 is a graph comparing results of evaluating the thermal durability of different pellicles through the pellicle thermal durability evaluation device according to the embodiment of the present invention.

Referring to FIG. 16, after preparing pellicles containing a pellicle membrane having a Metal #1 (3 nm Ru)/SiN structure, a pellicle membrane having a Ceramics #1 (13 nm a-Mosi2)/SiN structure, a pellicle membrane having a Ceramics #2 (13 nm h-MoSi2)/SiN structure, and a pellicle membrane having a Ceramics #3 (13 nm t-MoSi2)/SiN structure, thermal durability for each pellicle is measured and indicated through the pellicle thermal durability evaluation device according to the embodiment described with reference to FIG. 1. As shown in FIG. 16, it is confirmed that temperatures measured through the pellicle thermal durability evaluation device according to the embodiment are indicated differently from each other depending on the type of pellicle membrane. Thus, it is found that the thermal durability can be evaluated for pellicle membranes of various structures, through the pellicle thermal durability evaluation device according to the embodiment.

FIG. 17 is a graph showing results of calculating the thermal emissivity of the pellicle through the pellicle thermal durability evaluation device according to the embodiment of the present invention.

Referring to FIG. 17, ultraviolet (UV) is irradiated to the pellicle seated in the pellicle holding module, and the thermal emissivity of the pellicle irradiated with ultraviolet is calculated and indicated through the pellicle thermal durability evaluation device according to the embodiment described with reference to FIG. 1. The thermal emissivity is calculated through Equation 3 described above. As shown in FIG. 17, it is found that even the thermal emissivity of the pellicle can be derived through the pellicle thermal durability evaluation device according to the embodiment of the present invention.

FIG. 18 is a table showing temperature evaluation results according to thermal loads for pellicles having different structures, through the pellicle thermal durability evaluation device according to the embodiment of the present invention.

Referring to FIG. 18, after preparing pellicles containing a first metal (Metal #1)/SiN pellicle membrane (sample 1), a second metal (Metal #2)/pellicle membrane (sample 2), a first ceramic (Ceramics #1/SiN) pellicle membrane (sample 3), and a second ceramic (Ceramics #2/SiN) pellicle membrane (sample 4), temperatures subject to thermal loads are evaluated through the pellicle thermal durability evaluation device according to the embodiment. As specific experimental conditions, ultraviolet (UV) with a size of 0.28 $cm^2$ (based on 6 mm diameter) is used, and the experiment is performed in an environment of acceleration and $H_2$ purge (working pressure: 3 Pa). The heat resistance verification is conducted through temperature comparison under the same thermal load conditions as with/without destruction during short-term and long-term evaluation.

As shown in FIG. 18, the heat resistance according to type and thickness of a metal-based heat releasing layer is verified by comparing sample 1 with sample 2, the heat resistance of a new ceramic-based heat releasing layer compared to the existing metal-based heat releasing layer is verified by comparing sample 1 with sample 3, and the heat resistance according to thin film properties of a new ceramic-based heat releasing layer is verified by comparing sample 3 with sample 4.

FIG. 19 is a table showing results of experiments performed on the same pellicle under different thermal evaluation conditions, through the pellicle thermal durability evaluation device according to the embodiment of the present invention.

Referring to FIG. 19, the thermal durability is evaluated with different thermal evaluation conditions for the same pellicle, through the pellicle thermal durability evaluation device according to the embodiment. An environment in which an $H_2$ gas and H* generator is installed at the inlet of the chamber is assumed. In addition, the reliability is evaluated through 12 hour short-term and long-term evaluations.

As shown in FIG. 19, the mechanical/thermal durability of the pellicle according to a thermal load and an acceleration in a high vacuum $H_2$ purge environment inside an EUV scanner is verified by comparing Experimental Condition 1 (Experimental #1) with Experimental Condition 2 (Experimental #2), the effect of H* generated during an EUV scanning process onto the pellicle membrane thickness, composition ratio and durability is verified by comparing Experimental Condition 2 (Experimental #2) with Experimental Condition 3 (Experimental #3), and the durability of the pellicle according to an exposure time change of an EUV exposure process is verified by comparing Experimental Condition 2 (Experimental #2), Experimental Condition 4 (Experimental #4), and Experimental Condition 5 (Experimental #5).

Although the present invention has been described in detail using exemplary embodiments, the scope of the present invention is not limited to the specific embodiments, and shall be interpreted by the appended claims. In addition, it will be apparent that a person having ordinary skill in the art may carry out various deformations and modifications for the embodiments described as above within the scope without departing from the present invention.

INDUSTRIAL APPLICABILITY

The pellicle holding module, the pellicle thermal durability evaluation device including the same, and the pellicle thermal durability evaluation method according to an embodiment of the present application may be used for an EUV semiconductor process.

The invention claimed is:

1. A pellicle thermal durability evaluation device comprising:

a durability measurement unit comprising a chamber, a pellicle holder disposed in the chamber and on which the pellicle is seated, and a temperature measurement module configured to measure a temperature of the pellicle seated on the pellicle holder; and a light source unit configured to control intensity of light according to a type of the pellicle seated on the pellicle holder to irradiate the pellicle with the light;

wherein the durability measurement unit is configured to calculate, after the irradiating the light to the pellicle and before the measuring the temperature of the pellicle, a thermal load absorbed by the pellicle, and wherein the temperature of the pellicle is measured according to the thermal load absorbed by the pellicle.

2. The pellicle thermal durability evaluation device of claim 1, wherein the light has a wavelength range of 193 nm or more.

3. The pellicle thermal durability evaluation device of claim 1, wherein the light source unit comprises a light source configured to irradiate the light, a first light control module configured to control intensity of the light irradiated from the light source, a second light control module configured to control a size of light irradiated from the light source, and a third light control module configured to control intensity distribution of the light irradiated from the light source.

4. The pellicle thermal durability evaluation device of claim 3, wherein the light source unit further comprises a first reflection module configured to reflect the light controlled through the first to third light control modules, a second reflection module configured to reflect the light reflected from the first reflection module, and a light measurement module configured to receive the light reflected from the second reflection module to measure intensity of the light, in which a part of the light reflected from the first reflection module is provided to the pellicle, and another part of the light reflected from the first reflection module is provided to the second reflection module.

5. The pellicle thermal durability evaluation device of claim 1, wherein the chamber comprises an inlet through which hydrogen ($H_2$) gas is introduced.

6. The pellicle thermal durability evaluation device of claim 1, wherein the light source unit comprises a rotating slit configured to control a time when the pellicle is exposed to the light by controlling the light, which is irradiated to the pellicle, in a pulse form.

7. The pellicle thermal durability evaluation device of claim 1, wherein the pellicle holder is configured to move in a first direction and a second direction perpendicular to the first direction.

8. A pellicle thermal durability evaluation method comprising:

seating a pellicle on a pellicle holder disposed in a chamber;

calculating intensity of light irradiated to the pellicle according to a type of the pellicle;

controlling the intensity of the light with the calculated intensity of the light to irradiate the controlled light to the pellicle;

calculating a thermal load absorbed by the pellicle; and measuring a temperature of the pellicle, wherein the temperature of the pellicle is measured according to the thermal load absorbed by the pellicle.

9. The pellicle thermal durability evaluation method of claim 8, wherein the calculating of the intensity of the light irradiated to the pellicle comprises:

calculating the intensity of the light irradiated to the pellicle by providing absorbance data of the pellicle for the light to a database containing intensity data of extreme ultraviolet (EUV) and absorbance data of the pellicle for EUV.

* * * * *